US007928737B2

(12) United States Patent
Hernandez

(10) Patent No.: US 7,928,737 B2
(45) Date of Patent: Apr. 19, 2011

(54) ELECTRICAL OVERSTRESS AND TRANSIENT LATCH-UP PULSE GENERATION SYSTEM, CIRCUIT, AND METHOD

(76) Inventor: Marcos Hernandez, San Jose, CA (US)

( * ) Notice: Subject to any disclaimer, the term of this patent is extended or adjusted under 35 U.S.C. 154(b) by 504 days.

(21) Appl. No.: 12/126,039

(22) Filed: May 23, 2008

(65) Prior Publication Data
US 2009/0289636 A1 Nov. 26, 2009

(51) Int. Cl.
*G01R 31/08* (2006.01)
*G06F 19/00* (2006.01)

(52) U.S. Cl. ........................................ 324/527; 702/124

(58) Field of Classification Search .................. 324/527, 324/512, 500, 555, 765, 522, 523; 702/108, 702/117, 118, 124, 126
See application file for complete search history.

(56) References Cited

U.S. PATENT DOCUMENTS

| | | | | |
|---|---|---|---|---|
| 5,568,054 A | * | 10/1996 | Iino et al. | 324/750.05 |
| 5,910,873 A | * | 6/1999 | Boluna et al. | 361/56 |
| 6,611,040 B2 | * | 8/2003 | Gelsomini et al. | 257/530 |
| 6,781,887 B2 | * | 8/2004 | Gelsomini et al. | 365/189.16 |
| 6,807,507 B2 | * | 10/2004 | Kumar et al. | 702/124 |
| 6,930,501 B2 | | 8/2005 | Bargstadt-Franke et al. | |
| 6,943,578 B1 | * | 9/2005 | Sanda et al. | 324/762.02 |
| 7,181,352 B2 | | 2/2007 | Iyer et al. | |

OTHER PUBLICATIONS

Kelly, et al., "Developing a Transient Induced Latch-up Standard for Testing Integrated Circuits", Electrical Overstress/Electrostatic Discharge Symposium Proceedings, 1999, pp. 178-189.

ORYX Instruments Corp., "Triton: The Only Automated Wafer Level ESD or TLP Tester", Product Brochure, Aug. 2005 (2 pages).
Thermo Electron Corporation, "KeyTek ZAPMASTER MK.4 Combination ESD & Latch-Up Test System", product brochure, 2006 (2 pages).
Thermo Electron Corporation, "High Pin Count Rapid Relay-Based ESD & Latch-Up Test System for Evaluating Advanced IC Devices", product brochure, 2006 (5 pages).
Thermo Scientific, "Thermo Scientific Orion", product brochure, 2008 (2 pages).
Thermo Scientific, "Thermo Scientific EX11000", product brochure, 2008 (2 pages).
Thermo Scientific, "Thermo Scientific Celestron", product brochure, 2008 (4 pages).

* cited by examiner

*Primary Examiner* — Hoai-An D Nguyen
(74) *Attorney, Agent, or Firm* — Wood, Herron & Evans, LLP

(57) ABSTRACT

A circuit arrangement, system, and method to test a device with a plurality of pins for electric overstress and transient induced latch-up characteristics. The circuit arrangement includes an inverting operational amplifier with a unity gain to receive a triggering signal and supply an inverted signal to a power amplifier. The power amplifier transforms the inverted signal into a test signal, which is received by a ratio circuit. The test signal is further operable to test the electric overstress and transient induced latch-up characteristics of the device. The ratio circuit transforms the test signal into a ratio signal. The ratio signal has a voltage magnitude that corresponds to the current magnitude of the test signal. The test signal and ratio signal are measured to determine if, during testing, the device or a component of the device has failed.

27 Claims, 3 Drawing Sheets

ELECTRICAL OVERSTRESS AND TRANSIENT LATCH-UP PULSE GENERATION SYSTEM, CIRCUIT, AND METHOD

FIELD OF THE INVENTION

The present invention relates to testing electrical devices, and more particularly to testing electrical devices for electrical overstress and transient induced latch-up.

BACKGROUND OF THE INVENTION

Integrated circuits are the backbone of computers and most modern consumer electronics. In a typical integrated circuit fabrication, various semiconductor materials are formed into ingots typically comprised of nearly pure silicon, then sliced into wafers. Each wafer is typically processed through deposition, removal, patterning, and/or modification of electrical properties such that a plurality of dies are formed on the wafer. The dies are generally cut from the wafer, placed in packages, wired to pins of the package, and sealed, resulting in individual integrated circuits. During the fabrication of the integrated circuits, the wafers and dies are often tested after various processing steps to determine if the wafer has been damaged and/or to determine if the dies function properly. However, these tests are typically optimized by the fabricator to test the functionality of each die rather than their tolerances. As such, further testing of the integrated circuits is required to determine whether the integrated circuits can withstand real-world conditions.

Despite advances in technology and power systems, integrated circuits often experience inputs (typically called "transients"), whether on power, input, output, or input/output ("I/O") pins, that can cause unexpected functionality, errors, failure, or even destruction of components of integrated circuits. These transients generally include electrostatic discharge, voltage spikes, voltage drops, current spikes, current drops, electromagnetic radiation, and other electrical noise. Integrated circuits are generally designed to withstand some amount of these transients such that the transients neither produce erroneous results, nor cause failure of the integrated circuit, as the circuit continues to operate.

After fabrication and production of a batch of integrated circuits is complete, a subset of the integrated circuits are typically removed and undergo transient testing to determine a baseline of transient responses for the batch (i.e., whether the subset of integrated circuits output erroneous results or are destroyed by the transients). Typically, a first set of these "test" integrated circuits undergo tests for electrical overstress (EOS) or other electrostatic discharge (ESD), while a second set of test integrated circuits undergo tests for transient induced latch-up (TLU). In some circumstances, a third set of test integrated circuits undergo tests for electrical fast transients (EFT) and a fourth set of test integrated circuits undergo tests for radiated immunity (RI). An EOS test generally includes causing a sudden and momentary increase of power (for example, electrical current) on one pin of an integrated circuit (typically a power pin) then determining if any of the semiconductor materials from which the integrated circuit is made have been damaged. A TLU test generally includes causing a spike of positive or negative voltage on one pin of an integrated circuit to determine if a low-input impedance path has been inadvertently created between the power supply of the integrated circuit and ground. An EFT test generally includes causing a high frequency disturbance on one input/output pin of an integrated circuit to determine if an undesired operating mode has been created. A RI test generally includes exposing an integrated circuit to radiated electromagnetic energy while it is running to determine if the integrated circuit continues to operate without any degradation of performance. Generally, a batch of integrated circuits is tested only to determine their responses to the EOS and TLU tests.

Conventional tests for EOS and TLU generally require different testing methodologies and implementations. EOS testing requires that a sudden and momentary increase of power be transferred to a power supply pin of the integrated circuit. Conventional EOS test implementations typically include at least one capacitor that is switched from a charging mode to a discharge mode, thereby discharging into the integrated circuit. However, this EOS testing implementation is crude and often results in wild fluctuations in the power stored by the capacitor as well as excess leakage current through the capacitor. This method requires an increased time to charge the capacitor for each EOS test, ignores the properties of real world spikes that are experienced by integrated circuits (i.e., the discharge is often much larger than those experienced by integrated circuits in the real world), and often destroys the integrated circuit because the spike of power is typically too difficult to finely control. Furthermore, the EOS test signal may not have sufficient duration to effectively test for EOS characteristics of the integrated circuit. For example, conventional EOS testing may partially damage the integrated circuit, resulting in an integrated circuit that may operate normally under normal conditions, yet exhibit erroneous operation outside of normal conditions. Because a subset of a completed batch integrated circuits are used to indicate the viability of the entire batch, partially damaged integrated circuits typically indicate false positives, resulting in defective integrated circuits being marketed and sold.

TLU testing, on the other hand, generally requires that a spike of positive or negative voltage be sustained for a longer period of time than the sudden and momentary power increase of the EOS testing to trigger a parasitic structure of a component of the integrated circuit that acts as a short circuit, and thus creates the low-impedance path. In this manner, conventional TLU test implementations typically use separate pulse generation circuits and pulse amplification circuits. However, TLU testing implementation is generally costly, time consuming, and requires additional considerations of the noise effects on the TLU testing signal from the circuitry in the pulse generation circuits and pulse amplification circuits.

Testing costs, methodologies, and implementations to test EOS and TLU characteristics of integrated devices are increased because EOS and TLU testing often require different test signal circuits, different ways to test the integrated circuits, and different implementations, all the while ignoring real world conditions that may be experienced by the integrated devices. Moreover, EOS and TLU testing is often time consuming and laborious when more than one pin of an integrated circuit is tested, requiring constant readjustment of the integrated circuit and relocation of hardware, circuitry, measurement, and/or other test equipment to perform the tests. Consequently, there is a continuing need for accuracy in EOS and TLU testing of an integrated circuit, and particularly a continuing need to quickly and efficiently test both the EOS and TLU characteristics of an integrated circuit.

SUMMARY OF THE INVENTION

Embodiments of the invention address these and other deficiencies in the art by providing a circuit arrangement to produce a test signal and a ratio signal to test a device. The circuit arrangement includes an inverting operational amplifier with a unity gain receiving a triggering signal and transforming the triggering signal into an inverted signal. The circuit arrangement further includes a power amplifier receiving the inverted signal and transforming the inverted signal into the test signal and a ratio circuit receiving the test signal and transforming the test signal into the ratio signal. The test signal is used to test either a transient induced latch-up or an electrical overstress characteristic of the device, while the ratio signal is such that the amplitude of the voltage of the ratio signal substantially corresponds to the amplitude of the current of the test signal. Pulses of the test signal and ratio signal may be measured before, during, and after testing to determine if there is an abnormal voltage and/or current on the test signal that may indicate a failure of the device.

In an alternate embodiment of the invention, a system is provided to test a transient induced latch-up and an electrical overstress characteristic of a device of the type that includes a plurality of pins. The system includes a pulse generation circuit operable to produce a test signal and a ratio signal. The pulse generation circuit further includes an inverting operational amplifier with a unity gain, which receives a triggering signal from a digital-to-analog converter and transforms the triggering signal into an inverted signal. A power amplifier receives the inverted signal and transforms the inverted signal into the test signal. A ratio circuit receives the test signal and transforms the test signal into the ratio signal. The system further includes a relay pin matrix, which receives both the test signal and the device. The relay pin matrix may be programmatically controlled to relay the test signal to at least one pin from among a plurality of pins of the device. An oscilloscope is further provided to measure the test signal and the ratio signal while a controller interfaces with the oscilloscope and stores the measured test signal and ratio signal. The controller may programmatically control the relay pin matrix to relay the test signal to a pin on the device, as well as provide the triggering signal. The ratio signal may be set such that the amplitude of the voltage of the ratio signal substantially corresponds to the amplitude of the current of the test signal. In this embodiment, the controller may also create a test plan for testing of the transient induced latch-up and electrical overstress characteristic of the device. The controller may additionally provide an indication in response to detecting an abnormal test signal or an abnormal ratio signal.

A method for testing a device having a plurality of pins is provided for a system including a pulse generation circuit, a relay pin matrix, an oscilloscope, and a controller. The pulse generation circuit is electrically connected to the relay pin matrix, oscilloscope, and controller. Additionally, the controller is electrically connected to the relay pin matrix and the oscilloscope. The method includes programmatically controlling the relay pin matrix with the controller to relay a signal from the pulse generation circuit to at least one pin of the device and producing a triggering signal. The triggering signal may be transformed into a test signal operable to test either a transient induced latch-up or an electrical overstress characteristic of the device as well as a ratio signal with the pulse generation circuit. The triggering signal is transformed into the test signal and ratio signal by first converting the triggering signal with an analog-to-digital converter. The converted triggering signal is received at the pulse generation circuit and transformed into an inverted signal with an inverting operational amplifier having a unity gain in the pulse generation circuit. The inverted signal is transformed into the test signal with the power amplifier and the test signal is transformed into the ratio signal with a ratio circuit in the pulse generation circuit. The test signal is relayed to at least one pin of the device, while the ratio signal represents the amplitude of the voltage of the ratio signal and substantially corresponds to the amplitude of the current of the test signal. The test signal and ratio signal are measured by the oscilloscope during the testing. Either the transient induced latch-up or electrical overstress characteristic of the device is determined by relaying that test signal to at least one pin of the device and measuring the test signal and/or the ratio signal.

Throughout the embodiments, the test signal may provide a direct current voltage from about positive thirty volts to about negative thirty volts with a width of about twenty microseconds to about one millisecond. During transient induced latch-up testing, the test signal may have a width range of about nineteen microseconds to about twenty-one microseconds. During electrical overstress testing, the test signal may have a width range of about 750 microseconds to about 780 microseconds.

Also throughout the embodiments, the ratio circuit further includes a conditioning operational amplifier, which receives the test signal and transforms the test signal into the ratio signal. Alternately, the ratio circuit may also include a first conditioning operational amplifier operable which receives the test signal and transforms the test signal into a limited ratio signal, and a second conditioning operational which receives the limited ratio signal and transforms the limited ratio signal into the ratio signal. The device tested may be a CMOS device, a bipolar device, or a BiCMOS device.

These and other advantages will be apparent in light of the following figures and detailed description.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Embodiments of the present invention include a system, circuit, and method to test transient induced latch-up and electrical overstress characteristics of a device.

Figure 1:
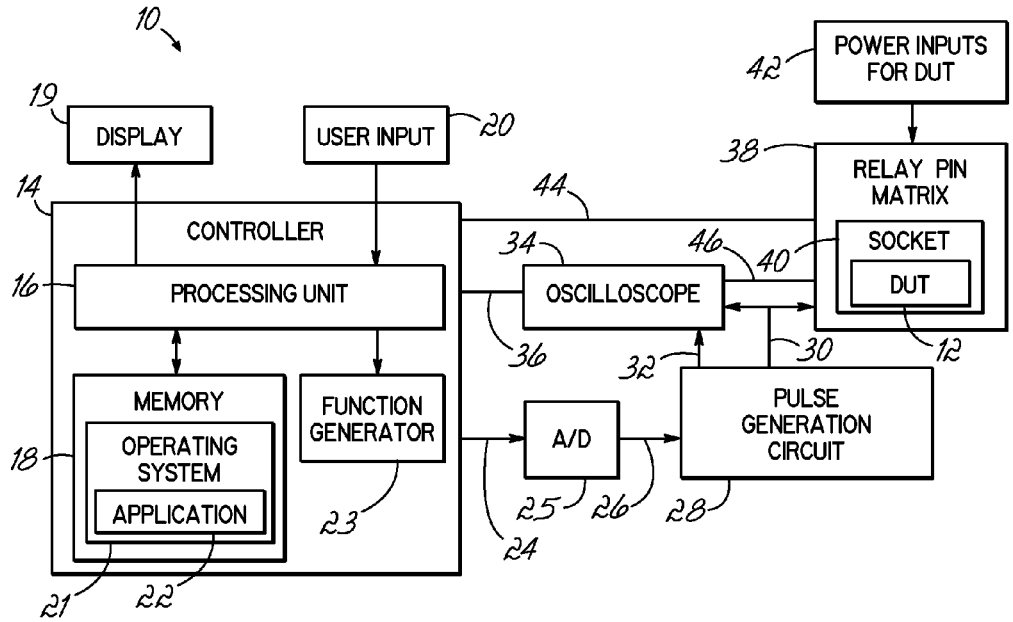
FIG. 1 is diagrammatic illustration of a system operable to test the EOS and TLU characteristics of a device consistent with embodiments of the invention.

FIG. 1 is a diagrammatic illustration of one embodiment of a system 10 operable to test a transient induced latch-up and electrical overstress characteristic of a device under test 12 (shown as "DUT," and hereinafter, "device" 12). The transient induced latch-up and electrical overstress characteristic may include that the device 12 has not failed at a particular level of testing, that the device 12 can withstand a particular level of testing, that the device 12 exhibits erroneous and/or faulty behavior at and/or after a particular level of testing, or that the device 12 has failed at a particular level of testing. The device 12 is typically an integrated circuit in a package that includes a plurality of connection pins. The device 12 may include complimentary metal-oxide-semiconductor ("CMOS") devices, bipolar devices, or bipolar-CMOS ("BiCMOS") devices, among others.

The system 10 includes a controller 14 that controls the testing of the device 12 as well as other operations of the system 10. The controller 14 typically includes at least one processing unit 16 communicating with a memory 18. The processing unit 16 may be one or more microprocessors, micro-controllers, field-programmable gate arrays, or ASICs, while memory 18 may include random access memory (RAM), dynamic random access memory (DRAM), static random access memory (SRAM), flash memory, memristors, and/or another digital storage medium. As such, memory 18 may be considered to include memory storage physically located elsewhere in controller 14, e.g., any cache memory in the at least one processing unit 16, as well as any storage capacity used as a virtual memory, e.g., as stored on a mass storage device, a computer, or another controller coupled to controller 14 by way of a network (not shown). In specific embodiments, the controller 14 may be a computer, computer system, server, disk array, or programmable device such as a multi-user computer, a single-user computer, a handheld device, a networked device, or other programmable electronic device and further include a display and user input device (neither shown). As such, controller 14 may include a display 19 and user input 20 to display information to a user and receive information from the user, respectively. Similarly, memory 18 may include an operating system 21 to run program code, or "application," 22 to control the system 10.

In addition to the processing unit 16 and memory 18, controller 14 may include a function generator 23. The function generator 23 is operable to produce at least one digital triggering signal diagrammatically illustrated at arrow 24 in response to programmed code executed by the controller 14, user interaction with the controller 14, or other commands received at the controller 14. As such, and in some specific embodiments, the function generator 23 may be a programmable function generator as is well known in the art. One having ordinary skill in the art will appreciate that the function generator 23 may be external to, and therefore externally controlled by, the controller 14. The system 10 further includes an A/D converter 25 that receives the digital triggering signal 24 and converts it into a converted triggering signal, or analog triggering signal diagrammatically illustrated at arrow 26, and hereinafter referred to as "triggering signal 26."

The triggering signal 26 may have a duration from about twenty microseconds to about one millisecond as well as have a magnitude range from about positive five volts (DC) to about negative five volts (DC). A pulse generation circuit 28 receives the triggering signal 26 and transforms it into a test signal diagrammatically illustrated at arrow 30 and a ratio signal diagrammatically illustrated at arrow 32. The test signal 30 may be used to test an electrical overstress ("EOS") characteristic of the device 12. EOS testing generally involves testing a device 12 up to and sometimes past its electrical tolerances. Thus, a pulse of positive voltage on an input, output, input-output ("I/O"), and/or power pin of the device 12 that exceeds the power supply voltage by a particular amount (i.e., a pulse of voltage with a range up to and above about 130 percent of the power supply voltage), or a pulse of negative voltage on an input, output, I/O, and/or power pin of the device 12 of a particular amount (i.e., a pulse of voltage with a range up to and above about negative fifty percent of the power supply voltage) may be sufficient for EOS testing.

Additionally, the test signal 30 is used to test a transient induced latch-up ("TLU") characteristic of the device 12. TLU testing generally involves testing the device 12 to determine if a pulse (i.e., a disturbance, transient, interruption, or other power spike, whether a voltage spike or a current spike) causes the device 12 to enter a high current mode indicative of latch-up. In general, a latch-up of a component of the device 12 creates a low-impedance path between the power supplied to the device 12 and ground, causing the component to act as a parasitic structure and triggering a short circuit that disrupts the proper functioning of the device 12. The low-impedance path through the device 12 may decrease the resistance of the device 12, and therefore increase the current drawn by the device 12. The increased current across this parasitic structure may lead to the destruction of the components on the device 12 and potentially render it inoperable. The TLU pulse is generally imposed on the voltage input(s) of the device 12, but may also be imposed at any location of the device 12 (i.e., on any pin of the device 12) where a component can be converted into a parasitic structure. Thus, a pulse of positive voltage on a negative voltage power pin or a pulse of negative voltage on a positive voltage power pin may be sufficient for TLU testing.

The ratio signal 32 is used to provide a signal with a voltage that corresponds to the current of the test signal 30. In one specific embodiment, for each ampere of current on the test signal 30, the pulse generation circuit 28 outputs the ratio signal 32 with a voltage of one volt. For example, if the test signal 30 is providing a pulse with positive ten volts and three amps of current, the ratio signal 32 consists of a pulse with positive three volts. Thus, the test signal 30 is not subject to an in-line current measurement that may otherwise skew measurements to determine the EOS and/or TLU characteristics of the device 12.

The test signal 30 and ratio signal 32 may be measured by an oscilloscope 34 before, during, and/or after the pulse. The oscilloscope 34 may be a digital storage oscilloscope with about a 100 MHz bandwidth, single shot capability, multiple channels, and speed greater than about one sample per nanosecond, though one of ordinary skill in the art would realize that other oscilloscope or monitoring devices may also be used. Oscilloscope 34 may be interfaced by, and controlled by, controller 14 through a control line diagrammatically illustrated at 36. In this way, the oscilloscope 34 and controller 14 may communicate bi-directionally. Alternately, the controller 14 and oscilloscope 34 may communicate bi-directionally through wireless communications. In this manner, controller 14 may control oscilloscope 34 to measure the test signal 30 and the ratio signal 32, while oscilloscope 34 may transmit data, including captured measurements of the test signal 30 and ratio signal 32, to the controller 14.

To relay the test signal 30 to particular pins of the device 12, the system 10 may include a programmable relay pin matrix 38 that receives the device 12 in a socket 40. The programmable relay pin matrix 38 may be a switching matrix that provides the capability for any pin of the device 12 to be grounded, floated, receive the test signal 30, and/or be connected to one or more voltage, bias voltage, current, and/or bias current inputs, collectively "power inputs" 42. The relay pin matrix 38 is programmatically controlled by the controller 14 by way of the control line diagrammatically shown at 44 to ground, float, and/or electrically connect any pin (including groups of pins) of the device 12 to the test signal and/or power inputs 42. Additionally, in some embodiments, the oscilloscope 34 may be configured to measure at least one output of the device by way of the measurement line diagrammatically shown at 46. Thus, the oscilloscope 34 may be connected, by the relay pin matrix 38 and through 46, to any pin or group of pins of the device 12. One having ordinary skill in the art will appreciate that the relay pin matrix 38 may be further operable to provide power from the power inputs 42 to pins that are not being tested. In this manner, the device 12 may be powered or grounded while receiving logic high or logic low on those pins that do not receive the test signal 30 during the EOS and TLU tests.

In one embodiment, the relay pin matrix 38 may receive the device 12 in a socket 40 with holes corresponding to the number of pins of the device 12 (both locationally and numerically). In that embodiment, the socket 40 may be a removable socket and replaceable with another removable socket with holes corresponding to a number of pins of another device (both locationally and numerically) to receive the other device. In an alternate embodiment, the relay pin matrix 38 may receive the device 12 in a socket 40 with a plurality of holes greater than or equal to the number of pins of the device 12. Thus, the relay pin matrix 38 is controlled by the controller 14 such that only those plurality of holes, or a subset of those plurality of holes, in the socket 40 that receive a pin of the device 12 are used for EOS and TLU testing. In specific embodiments, suitable sockets 40 are zero-insertion-force sockets (i.e., "ZIF" sockets) or low-insertion-force sockets (i.e., "LIF" sockets) as are well known in the art. In one embodiment, the relay pin matrix 38 is operable to receive a device 12 with up to about 2304 pins, though one having ordinary skill in the art will appreciate that relay pin matrix 38 may be operable to receive a device 12 with more or fewer pins. The system 10 may also include a clock generator in electrical communication with relay pin matrix 38 to provide a clock signal to any pin of the device 12.

Figure 2:
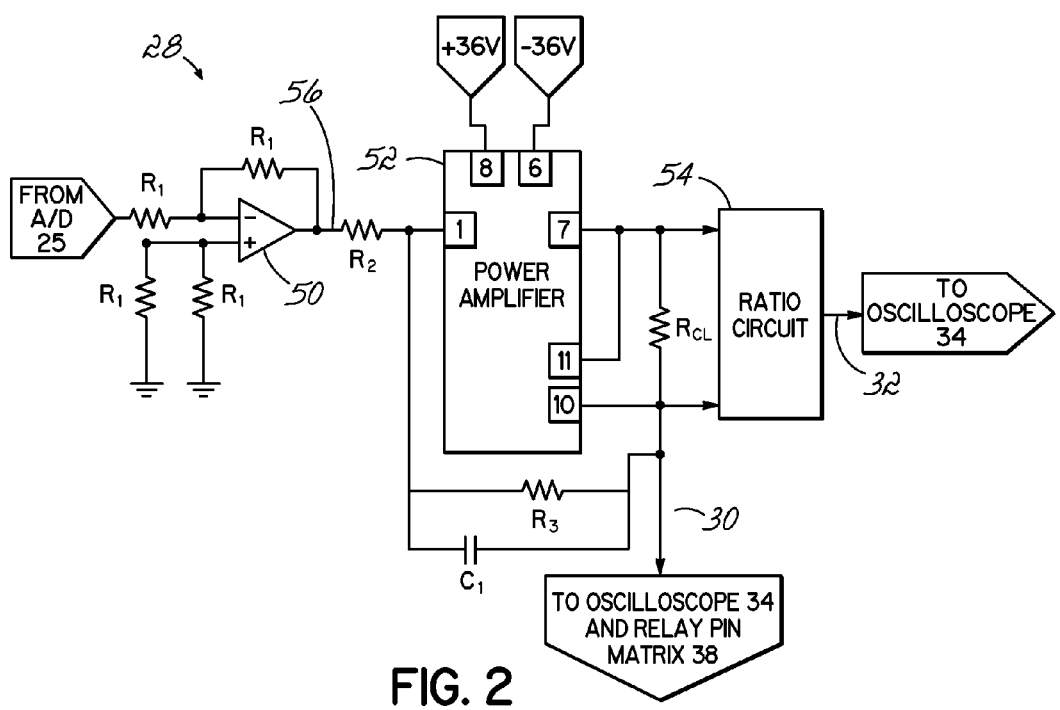
FIG. 2 is a schematic illustration of a circuit arrangement of the system of FIG. 1 operable to receive a triggering signal, and produce a test signal and a ratio signal.

FIG. 2 is a detailed schematic illustration of an exemplary circuit arrangement of the pulse generation circuit 28. The pulse generation circuit 28 produces the test signal 30 to test the EOS and TLU characteristics of the device 12, and the ratio signal 32 that indicates, by way of a ratio of the current of the test signal 30 to the voltage of the ratio signal 32, the current of the test signal 30. The pulse generation circuit 28 includes a first operational amplifier 50, a power amplifier 52, and a ratio circuit 54 comprised of one or more operational amplifiers.

The first operational amplifier 50 of the pulse generation circuit 28 receives the triggering signal 26 from the A/D converter 25 on its negative input port. Each resistor R1 shown connected to the first operational amplifier 50 has about the same resistance, and in one specific embodiment, each resistor R1 has a resistance of about ten kilo-ohms. In this manner, the first operational amplifier 50 may operate as a buffer, and more particularly as a unity gain inverting operational amplifier. As such, the first operational amplifier 50 is operable to receive the triggering signal 26 on its negative terminal and transform the triggering signal 26 into an inverted signal diagrammatically illustrated at 56. Thus, the first operational amplifier 50 buffers and inverts the triggering signal 26.

The power amplifier 52 receives the inverted signal 56 from the first operational amplifier 50 and produces the test signal 30. In one specific embodiment, the power amplifier 52 may be a PA04 power MOSFET, as produced by Cirrus Logic of Austin, Tex., in a JEDEC MO-127 twelve-pin package. As shown in FIG. 2, several connection pins of the power amplifier 52 are indicated. The inverted signal 56 is tied to pin one of the power amplifier 52, while the outputs are pin seven, pin eleven, and pin ten. Pin eleven is tied to pin seven while pin ten is tied to pin seven on the load side (i.e., test signal 30 side leading to the device 12) of resistor RCL to bypass any parasitic resistances of the power amplifier 52 itself. As such, and in a specific embodiment, resistor RCL has a value of about 0.068 ohms. In some embodiments, resistors R2 and R3 have a ratio of about 1:10, and in a specific embodiment, resistor R2 is about two kilo-ohms and resistor R3 is about twenty kilo-ohms. As shown in FIG. 2, pin eight of the power amplifier 52 is supplied with about positive thirty-six volts (DC), while pin six is supplied with about negative thirty-six volts (DC). The power amplifier 52 is operable to act as an inverting operational amplifier with a gain of about ten. Thus, the power amplifier 52 receives the inverted signal 56 and produces the test signal 30 such that the test signal 30 has a gain and opposite polarity as that of the inverted signal 56. However, due to the non-ideal character of real-world circuitry and electrical characteristics, the test signal 30 may be limited to a range of about positive thirty volts and about negative thirty volts. As shown in FIG. 2, the pulse generation circuit 28 includes a capacitor C1 that is used to reduce fluctuations on the test signal 30 as the inverting signal 56 changes. In a specific embodiment, capacitor C1 may have a capacitance of about ten picofarads.

The test signal 30 is received by oscilloscope 34, the relay pin matrix 38, and the ratio circuit 54. During EOS and TLU testing, the test signal 30 may be a pulse, series of pulses, train of pulses, or other signal provided to the relay pin matrix 38 and finally the device 12. The test signal 30 carries a level of current dependent on the resistance of cables to the relay pin matrix 38, internal circuitry of the relay pin matrix 38, connections of the relay pin matrix 38 to the socket 40, internal components of the socket 40, connections of the socket 40 to the device 12, internal circuitry of the device 12, and/or subsequent connections to a return or ground. Typically, the largest of these resistances is the resistance of the internal circuitry of the device 12. When the device 12, or a component of the device 12, experiences a failure or component latch-up (i.e., latch-up of some internal circuitry of the device 12), the resistance of the internal circuitry of the device 12 typically decreases. With reference to Ohm's law (i.e., V=IR), the decrease in resistance increases the current in the test signal 30 while the voltage is held constant. By measuring the voltage and current on the pulses of test signal 30 before, during, and after EOS and TLU testing, it is possible to determine a failure of the device 12, or a component of the device 12, due to EOS or TLU.

The ratio circuit 54 establishes a ratio of test signal 30 current to ratio signal 32 voltage. As such, the ratio circuit 54 is operable to receive the test signal 30 and transform it into the ratio signal 32 such that the ratio signal 32 can be measured by the oscilloscope 34 to determine the current in the test signal 30. As previously discussed, the ratio of test signal 30 current to ratio signal 32 voltage may be about 1:1.

Figure 3:
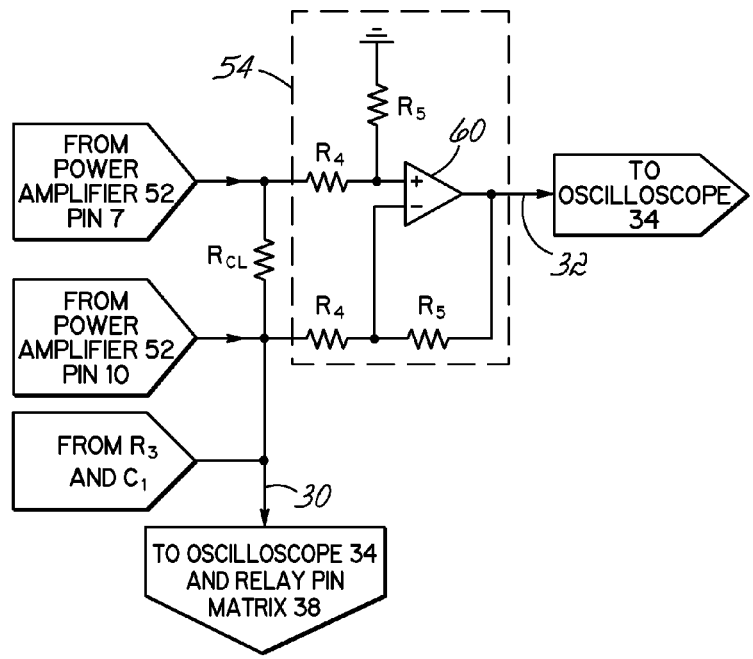
FIG. 3 is a schematic illustration of an embodiment of the ratio circuit of the circuit arrangement of FIG. 2 operable to receive and transform the test signal into the ratio signal.

FIG. 3 is a schematic illustration of the ratio circuit 54 of the pulse generation circuit 28 illustrated in FIG. 2 that utilizes an operational amplifier. The ratio circuit 54 of this embodiment includes a second operational amplifier 60 and resistors R4 and R5. As shown in FIG. 3, the second operational amplifier 60 is shown inverted and is configured, with resistors R4 and R5, to operate as a conditioning operational amplifier and transform the test signal 30 into the ratio signal 32. In a specific embodiment, resistors R4 and R5 have values of about 2.24 kilo-ohms and about 3.3 kilo-ohms, respectively. Thus, the output from the second operational amplifier 60, and therefore the ratio circuit 54, is the ratio signal 32 which may be measured by the oscilloscope 34 to indicate the amount of current in the test signal 30.

Figure 4:
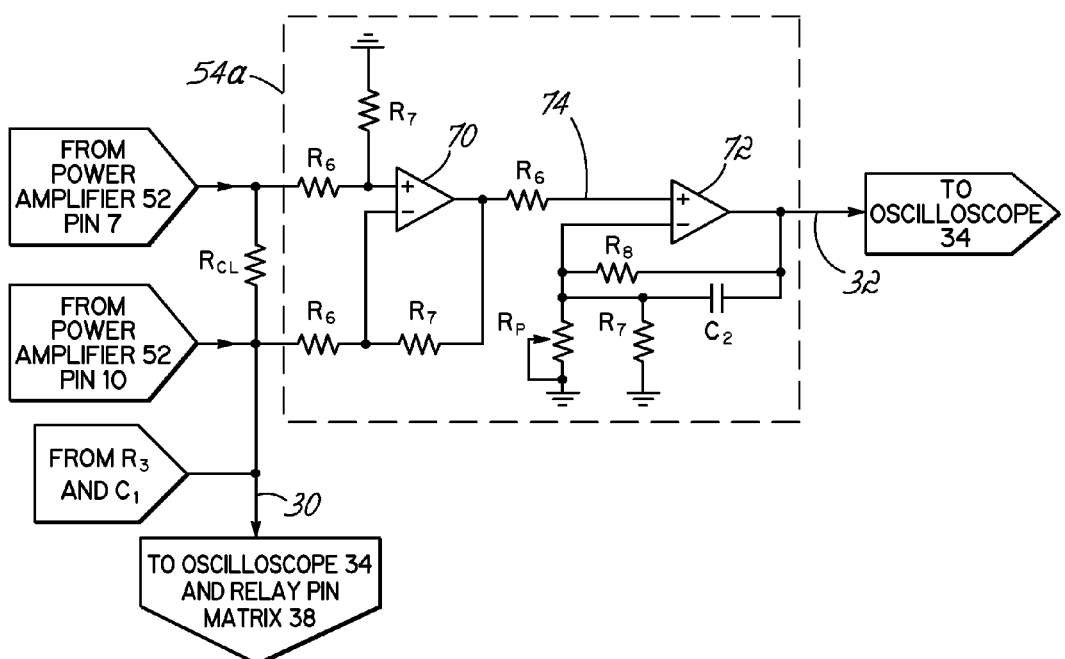
FIG. 4 is a schematic illustration of an alternate embodiment of the ratio circuit of the circuit arrangement of FIG. 2 operable to receive and transform the test signal into the ratio signal.

FIG. 4 is a schematic illustration of an alternate embodiment of a ratio circuit 54a of the pulse generation circuit 28 illustrated in FIG. 2 that utilizes two operational amplifiers. The ratio circuit 54a of this embodiment includes a third operational amplifier 70, a fourth operational amplifier 72, resistors R6, R7, and R8, potentiometer RP, and capacitor C2. As shown in FIG. 4, the third operational amplifier 70 is shown inverted and is configured, with resistors R6 and R7, to operate as a first conditioning operational amplifier and transform the test signal 30 into a limited ratio signal diagrammatically illustrated at 74. In a specific embodiment, resistors R6 and R7 have values of about ten kilo-ohms and about 5.11 kilo-ohms, respectively. Similarly, the fourth operational amplifier is shown inverted and is configured, with resistors R6, R7, and R8, potentiometer RP, and capacitor C2, to operate as a second conditioning operational amplifier and transform the limited ratio signal 74 into the ratio signal 32. In a specific embodiment, resistors R6 and R7 may again have values of about ten kilo-ohms and about 5.11 kilo-ohms, respectively, resistor R8 may have a value of about 100 kilo-ohms, potentiometer RP may have an adjustable value range of about 100 kilo-ohms, and capacitor C2 may have a value of about one picofarad. In other embodiments, potentiometer RP may be a "trimpot" style of potentiometer within a low profile, surface mount package. In these embodiments, potentiometer RP may be set to a fixed value before, or after, being configured in the ratio circuit 54a. Such fixed value for potentiometer RP is believed to stabilize the ratio signal 32 output from the ratio circuit 54a. Thus, the output from the fourth operational amplifier 72, and therefore the ratio circuit 54a, is the ratio signal 32 which may be measured by the oscilloscope 34 to indicate the amount of current in the test signal 30. It will be appreciated by one having ordinary skill in the art that the ratio circuit 54a with two operational amplifiers may provide a more stable ratio signal 32, particularly when the test signal 30 exceeds about positive twelve volts, and thus provide a more stable measurement of the voltage of ratio signal 32 that corresponds to the amperage of the test signal 30.

The system 10 may measure the voltage and/or current of the test signal 30 and ratio signal 32 before, during, and after each pulse to determine if there has been an increase in the voltage and/or current of the test signal 30, thus indicating a failure of the device 12. A current increase and/or a voltage increase on the test signal 30 and/or the ratio signal 32 may indicate that the device 12 has been damaged by the EOS test or that a latch-up of a component of the device 12 has occurred. Similarly, the current and voltage of the test signal 30 may be compared in current-voltage trace ("IV trace") on the oscilloscope 34 or the controller 14. In this manner, a shift in the IV trace beyond an allowed range may indicate that the device 12 has been damaged by the EOS test, or that a latch-up of a component of the device 12 has occurred. The testing for the EOS and TLU characteristic of the device 12 may be performed for each pin, specific pins, or groups of pins of the device 12. The system 10 is operable to test for both EOS and TLU. The test signal 30 produced by the pulse generation circuit 28 may have a pulse corresponding to the original triggering signal 26 (i.e., from about twenty microseconds to about one millisecond, as disclosed above) but have an amplitude from about positive thirty volts (DC) to about negative thirty volts (DC) depending on the input amplitude of the triggering signal 26 and the amplification of the pulse generation circuit 28. For example, the triggering signal 26 may have an amplitude of about positive 0.5 volts. Thus, the triggering signal 26 may be transformed by the pulse generation circuit 28 such that the test signal 30 has an amplitude of about positive five volts. The test signal 30 may also have a current of up to about five amperes. The pulse signal 32 produced by the pulse generation circuit 28 may also have a length corresponding to the original triggering signal 26 (i.e., again from about twenty microseconds to about one millisecond, as disclosed above) but have a voltage amplitude corresponding to the current in the test signal 30.

In an embodiment used for EOS testing, the test signal 30 may include a positive pulse on one or more input, output, I/O, and/or power pins of the device 12. The test signal 30 may include a pulse with an initial voltage of about 130 percent of the normal voltage to those pins, rounded to the nearest about 0.5 volts. The test signal 30 may be increased in about 0.5 volt increments and the voltage of the test signal 30 and voltage of the ratio signal 32 pulse(s) may be analyzed to determine if there has been a failure of the device 12. For example, and in one specific embodiment, when the normal voltage to the pin is about five volts, the initial voltage for the test signal 30 may be about 6.5 volts for EOS testing. In that embodiment, the voltage of the test signal 30 may be incremented by about 0.5 volts to about seven volts, and so forth, until the EOS characteristics of the device 12 have been determined.

In an alternate embodiment of EOS testing consistent with the invention, the test signal 30 may include a negative pulse on the one or more input, output, I/O, and/or power pins of the device 12. The test signal 30 may include a pulse with an initial voltage of about negative three volts. The voltage may then be decreased in about negative 0.5 volt increments and the voltage of the test signal 30 and voltage of the ratio signal 32 analyzed to determine if there has been a failure of the device 12. For example, and in one specific embodiment, when the normal voltage to the pin is about five volts, the initial voltage for the test signal 30 may be about negative three volts for EOS testing. In that embodiment, the voltage of the test signal 30 may be decremented by about 0.5 volts to about negative 3.5 volts, and so forth, until the EOS characteristics of the device 12 have been determined. The test signal 30 pulses for EOS testing may last from about 750 microseconds to about 780 microseconds.

In an embodiment used for TLU testing, the test signal 30 may include an initial pulse to approximately ground on one or more positive power pins of the device 12. The test signal 30 may be decreased in about negative 0.2 volt increments, with power removed after each step, until the test signal 30 reaches about negative 100 percent of the normal input voltage for that positive power pin. The voltage of the test signal 30 and voltage of the ratio signal 32 may be analyzed before and after the pulse(s) to determine if there has been a failure of the device 12. For example, and in one specific embodiment, the initial voltage for the test signal 30 may be about approximately ground for TLU testing. In that embodiment, the voltage of the test signal 30 may be decremented by about 0.2 volts to about negative five volts when the normal voltage supplied to the pin is about positive five volts until the TLU characteristics of the device 12 have been determined.

In an alternate embodiment of TLU testing, the test signal may include 30 include an initial pulse to approximately ground on one or more negative power pins of the device 12. The test signal 30 may be increased in about positive 0.2 volt increments, with power removed after each step, until the test signal 30 reaches about positive 100 percent of the normal input voltage for that negative power pin. The voltage of the test signal 30 and voltage of the ratio signal 32 may be analyzed before and after the pulse(s) to determine if there has been a failure of the device 12. For example, and in one specific embodiment, the initial voltage for the test signal 30 may be about approximately ground for TLU testing. In that embodiment, the voltage of the test signal 30 may be incremented by about 0.2 volts to about positive five volts when the normal voltage supplied to the pin is about negative five volts until the TLU characteristics of the device 12 have been determined. The test signal 30 pulses for TLU testing may last for about twenty microseconds, and in a specific embodiment lasts from about nineteen microseconds to about twenty-one microseconds.

Figure 5:
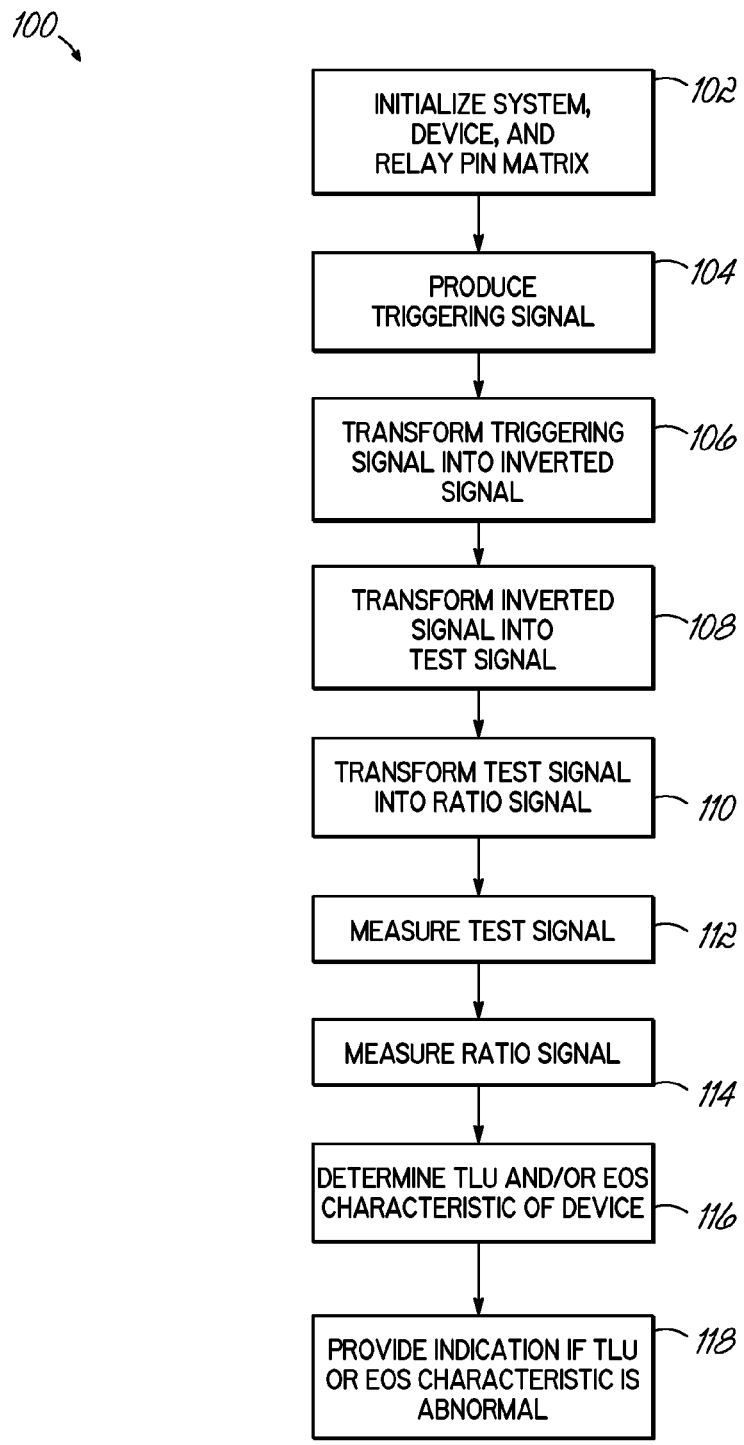
FIG. 5 is a flow diagram of a test process to test the EOS and TLU characteristic of a device with the system of FIG. 1.

FIG. 5 is a flow diagram 100 of a test process to test the EOS and/or TLU characteristic of a device with the system of FIG. 1 consistent with embodiments of the invention. In block 102, a user may initialize the system by loading the device into a relay pin matrix. The user may also and interact with an application to control the relay pin matrix to define the pins of the device connected to power inputs as well as the pins of the device connected to a test signal. In block 102, the user may define a trigger signal (including its length, magnitude, sequential increments, sequential steps, pulse, pulses, and/or other variables as disclosed above) and instruct the system of the type of test being performed (i.e., EOS, TLU, or a combination of both). The initialization in block 102 may further include initializing an oscilloscope by instructing the oscilloscope when to measure the test signal and a ratio signal. The user may then start the system by producing the triggering signal as shown in block 104. In block 104, a digital trigger signal is produced by a function generator and converted by an A/D converter 25 into the triggering signal 26.

In block 106, a first operational amplifier (such as a unity gain inverting operational amplifier) transforms the triggering signal into an inverted signal, while in block 108 a power power amplifier 52 transforms the inverted signal into the test signal. In block 110, a ratio circuit transforms the test signal into the ratio signal.

In block 112, the oscilloscope measures the pulses of test signal, while in block 114, the oscilloscope concurrently measures the ratio signal. As such, the oscilloscope may transmit the results of these measurements to the controller. In block 116, the controller receives the results of the measurements from the oscilloscope. The controller, or the application executing on the controller, may determine the EOS or TLU characteristic of the device, and in particular whether the device or a component of the device has failed, by determining whether a voltage and/or current increase has occurred on the test signal and/or the ratio signal or whether an I-V trace of the test signal beyond a certain range has occurred in block 116. When the EOS or TLU characteristic is abnormal, possibly indicating that the device or a component of the device has failed, the controller may provide an indication as such on a display in block 118.

It will be appreciated by one having ordinary skill in the art that the measurements of the test signal and ratio signal may occur at about the same time. Thus, although particular blocks are shown for the system to test the device in FIG. 5, the transformation of various signals, and the measurement of various signals, occurs quickly, and thus any of the exemplary blocks of the above flowchart may be augmented, replaced, merged, omitted, and/or rearranged while still being consistent with embodiments of the present invention. Furthermore, as shown throughout the various figures there may be two or more operational amplifiers in the pulse generation circuit 28. The operational amplifiers shown throughout FIGS. 2-4 may each be an OP37AJ operational amplifier as produced by Maxim Integrated Products of Sunnyvale, Calif.

While the present invention has been illustrated by a description of the various embodiments and the examples, and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. In particular, the A/D converter may be incorporated with the function generator, pulse generation circuit, and/or oscilloscope, and thus only produce the converted triggering signal (as opposed to the digital triggering signal). Similarly, the function generator may be incorporated with the oscilloscope.

Additionally, as shown throughout the various figures, the power connections and additional power circuitry for the individual components of the pulse generation circuit are not shown (with the exception of the positive and negative about thirty-six volt power inputs for the power amplifier). However, one having ordinary skill in the art will appreciate that exemplary power connections, including additional exemplary power circuitry (such as capacitors, resistors, and/or inductors) are well known in the art and thus easily locatable (such as in documentation describing the operational amplifiers and power amplifier available from the manufacturers). One having ordinary skill in the art will further appreciate that other operational amplifiers and power amplifiers other than those shown and described may be used without departing from the scope of the invention. For example, one having ordinary skill in the art will appreciate that operational amplifiers and/or power amplifiers with lesser or greater voltage output ranges may be used without departing from the scope of the invention. Furthermore, ratios other than those disclosed (i.e., 1:1 for test signal current to ratio signal voltage, 10:1 for the ratio of resistance between R3 and R2, and 10:1 for the ratio of voltage amplitude of test signal to triggering signal) may be used without departing from the scope of the invention. For example, another suitable ratio for test signal current to ratio signal voltage may be 1:2 or 1:4 to provide larger ranges of voltage from the ratio signal. For another example, another suitable ratio for the ratio of resistance between R3 and R2 may be 2:1, 4:1, or 8:1 to provide smaller ranges of voltages from the power amplifier. Accordingly, departures may be made from such details without departing from the spirit or scope of applicants' general inventive concept

What is claimed is:

1. A method of testing a device of the type that includes a plurality of pins with a system comprising a pulse generation circuit, a relay pin matrix, an oscilloscope, and a controller, wherein the pulse generation circuit is electrically coupled with the relay pin matrix, oscilloscope, and controller, and wherein the controller is electrically coupled with the relay pin matrix and oscilloscope, the method comprising:
programmatically controlling the relay pin matrix with the controller to relay a signal from the pulse generation circuit to at least one pin from among the plurality of pins of the device;
producing a triggering signal with the controller;
transforming the triggering signal into a test signal and a ratio signal with the pulse generation circuit, wherein the test signal is operable to test at least one of a transient induced latch-up or an electrical overstress characteristic of the device, transforming the triggering signal into the test signal and the ratio signal further comprising:
converting the triggering signal with an analog-to-digital converter, receiving the converted triggering signal at the pulse generation circuit, transforming the triggering signal into an inverted signal with an inverting operational amplifier having a unity gain in the pulse generation circuit, transforming the inverted signal into the test signal with the power amplifier electrically coupled with the inverting operational amplifier, wherein the test signal is the signal relayed to the at least one pin of the device, and transforming the test signal into the ratio signal with a ratio circuit electrically coupled with the power amplifier in the pulse generation circuit, wherein the ratio signal is such that the magnitude of the voltage of the ratio signal substantially corresponds to the magnitude of the current of the test signal;

measuring the test signal and the ratio signal with the oscilloscope during the testing;

in response to relaying the test signal to at least one pin of the device and measuring the ratio signal, determining at least one of the transient induced latch-up or electrical overstress characteristic of the device.

2. The method of claim 1, wherein the ratio circuit includes a conditioning operational amplifier operable to receive the test signal and transform the test signal into the ratio signal.

3. The system of claim 1, wherein the ratio circuit includes a first conditioning operational amplifier operable to receive the test signal and transform the test signal into a limited ratio signal, and a second conditioning operational operable to receive the limited ratio signal and transform the limited ratio signal into the ratio signal.

4. A method of selectively configuring a pulse generation circuit to output a test signal to test a transient induced latch-up or electrical overstress characteristic of a device of the type that includes a plurality of pins, the method comprising:

producing a triggering pulse with a controller;

transforming the triggering pulse into the test signal and a ratio signal with the pulse generation circuit, the pulse generation circuit electrically coupled with the controller and the device;

transforming the triggering pulse into an analog triggering signal with an analog-to-digital converter electrically coupled with the controller and the pulse generation circuit; wherein the pulse generation circuit includes an inverting operational amplifier having a unity gain, the inverting operational amplifier operable to receive the analog triggering signal from the digital-to-analog converter and transform the analog triggering signal into an inverted signal, a power amplifier electrically coupled to the inverting operational amplifier, the power amplifier operable to receive the inverted signal and transform the inverted signal into the test signal, and a ratio circuit electrically coupled to the power amplifier, the ratio circuit operable to receive the test signal and transform the test signal into the ratio signal, the ratio signal such that the magnitude of the voltage of the ratio signal substantially corresponds to the magnitude of the current of the test signal; and testing the device with the test signal.

5. The method of claim 4, further comprising:

measuring the test signal and the ratio signal with an oscilloscope, the oscilloscope electrically coupled with the pulse generation circuit and the controller; and analyzing the measured test signal and ratio signal to determine the transient induced latch-up or electrical overstress characteristic of the device.

6. The method of claim 4, wherein the ratio circuit includes a conditioning operational amplifier operable to receive the test signal and transform the test signal into the ratio signal.

7. The method of claim 4, wherein the ratio circuit includes a first conditioning operational amplifier operable to receive the test signal and transform the test signal into a limited ratio signal, and a second conditioning operational amplifier electrically coupled with the first conditioning operational amplifier, the second conditioning operational amplifier operable to receive the limited ratio signal and transform the limited ratio signal into the ratio signal.

8. A circuit arrangement to produce a test signal and a ratio signal, the test signal used to test a device, the circuit comprising:

a trigger signal generation circuit operable to generate a triggering signal; and a pulse generation circuit responsive to the triggering signal and operable to generate a test signal to be applied to the device and a ratio signal indicative of a current applied to the device by the test signal; wherein the pulse generation circuit including:

an inverting operational amplifier with a unity gain, the inverting operational amplifier operable to receive a triggering signal and transform the triggering signal into an inverted signal;

a power amplifier electrically coupled with the inverting operational amplifier, the power amplifier operable to receive the inverted signal and transform the inverted signal into the test signal; and a ratio circuit electrically coupled with the power amplifier, the ratio circuit operable to receive the test signal and transform the test signal into the ratio signal.

9. The circuit arrangement of claim 8, the ratio circuit including:

a first conditioning operational amplifier operable to receive the test signal and transform the test signal into a limited ratio signal; and a second conditioning operational amplifier electrically coupled with the first conditioning operational amplifier, the second conditioning operational amplifier operable to receive the limited ratio signal and transform the limited ratio signal into the ratio signal.

10. The circuit arrangement of claim 8, the test signal used to test a transient induced latch-up or an electrical overstress characteristic of the device.

11. The circuit arrangement of claim 8, the ratio circuit including:

a conditioning operational amplifier operable to receive the test signal and transform the test signal into the ratio signal.

12. A circuit arrangement to produce a test signal and a ratio signal, the test signal used to test a device, the circuit comprising:

an inverting operational amplifier with a unity gain, the inverting operational amplifier operable to receive a triggering signal and transform the triggering signal into an inverted signal;

a power amplifier electrically coupled with the inverting operational amplifier, the power amplifier operable to receive the inverted signal and transform the inverted signal into the test signal, the test signal used to test at least one of a transient induced latch-up or an electrical overstress characteristic of the device; and a ratio circuit electrically coupled with the power amplifier, the ratio circuit operable to receive the test signal and transform the test signal into the ratio signal, the ratio signal such that the magnitude of the voltage of the ratio signal substantially corresponds to the magnitude of the current of the test signal.

13. The circuit arrangement of claim 12, wherein a length of the test signal is from about twenty microseconds to about one millisecond.

14. The circuit arrangement of claim 12, wherein the circuit arrangement is operable to produce test signal to test the transient induced latch-up characteristic of the device for a range of about nineteen microseconds to about twenty-one microseconds.

15. The circuit arrangement of claim 12, wherein the circuit arrangement is operable to produce the test signal to test the electrical overstress characteristic of the device for a range of about 750 microseconds to about 780 microseconds.

16. The circuit arrangement of claim 12, wherein the ratio circuit comprises:
a conditioning operational amplifier operable to receive the test signal and transform the test signal into the ratio signal.

17. The circuit arrangement of claim 12, wherein the ratio circuit comprises:
a first conditioning operational amplifier operable to receive the test signal and transform the test signal into a limited ratio signal; and
a second conditioning operational amplifier electrically coupled with the first conditioning operational amplifier, the second conditioning operational amplifier operable to receive the limited ratio signal and transform the limited ratio signal into the ratio signal.

18. The circuit arrangement of claim 12, wherein a DC voltage of the test signal produced by the pulse generation circuit is from about positive thirty volts to about negative thirty volts.

19. A system to test a transient induced latch-up or an electrical overstress characteristic of a device of the type that includes a plurality of pins, the system comprising:
a pulse generation circuit operable to produce a test signal and a ratio signal, the pulse generation circuit including an inverting operational amplifier having a unity gain and electrically coupled with a digital-to-analog converter, the inverting operational amplifier operable to receive a triggering signal from the digital-to-analog converter and transform the triggering signal into an inverted signal, a power amplifier electrically coupled to the inverting operational amplifier, the power amplifier operable to receive the inverted signal and transform the inverted signal into the test signal, and a ratio circuit electrically coupled to the power amplifier, the ratio circuit operable to receive the test signal and transform the test signal into the ratio signal, the ratio signal such that the magnitude of the voltage of the ratio signal substantially corresponds to the magnitude of the current of the test signal;
a relay pin matrix electrically coupled to the pulse generation circuit, the relay pin matrix operable to receive the test signal and the device, the relay pin matrix programmatically controlled to relay the test signal to at least one pin from among the plurality of pins of the device to test the transient induced latch-up or electrical overstress characteristic of the device;
an oscilloscope electrically coupled with the pulse generation circuit, the oscilloscope operable to measure the test signal and the ratio signal; and
a controller electrically coupled to the analog-to-digital converter, oscilloscope, and relay pin matrix, the controller operable to interface with the oscilloscope and store the measured test signal and ratio signal, the controller operable to programmatically control the relay pin matrix to relay the test signal to the at least one pin from among the plurality of pins of the device, the controller operable to provide an analog triggering signal to be converted into the triggering signal by the analog-to-digital converter.

20. The system of claim 19, wherein the ratio circuit further comprises:
a first conditioning operational amplifier operable to receive the test signal and transform the test signal into a limited ratio signal; and
a second conditioning operational amplifier electrically coupled with the first conditioning operational amplifier, the second conditioning operational amplifier operable to receive the limited ratio signal and transform the limited ratio signal into the ratio signal.

21. The system of claim 19, wherein the controller is further operable to create a test plan for testing of the transient induced latch-up or electrical overstress characteristic of the device.

22. The system of claim 19, wherein the controller is further operable to provide an indication in response to detecting an abnormal test signal or an abnormal ratio signal.

23. The system of claim 19, wherein a DC voltage of the test signal produced by the pulse generation circuit is from about positive thirty volts to about negative thirty volts.

24. The system of claim 19, wherein a length of the test signal is from about twenty microseconds to about one millisecond.

25. The system of claim 19, wherein the pulse generation circuit is operable to produce the test signal to test the transient induced latch-up characteristic of the device for a range of about nineteen microseconds to about twenty-one microseconds.

26. The system of claim 19, wherein the pulse generation circuit is operable to produce the test signal to test the electrical overstress characteristic of the device for a range of about 750 microseconds to about 780 microseconds.

27. The system of claim 19, wherein the ratio circuit further comprises:
a conditioning operational amplifier operable to receive the test signal and transform the test signal into the ratio signal.

* * * * *

UNITED STATES PATENT AND TRADEMARK OFFICE
CERTIFICATE OF CORRECTION

| | |
|---|---|
| PATENT NO. | : 7,928,737 B2 |
| APPLICATION NO. | : 12/126039 |
| DATED | : April 19, 2011 |
| INVENTOR(S) | : Marcos Hernandez |

It is certified that error appears in the above-identified patent and that said Letters Patent is hereby corrected as shown below:

In the Specification:

At column 1, line number 45, change "are" to --is-- and in line 46, change "undergo" to --undergoes-- and in line 50, change "undergo" to --undergoes-- and in line 52, change "undergo" to --undergoes-- and in line 54, change "undergo" to --undergoes-- and in line 56, change "undergo" to --undergoes--.

At column 2, line number 31, change "are" to --is--.

At column 4, line number 22, after "amplifier", delete "operable" and in line 39, after "is", insert --a--.

At column 5, line number 5, change "complimentary" to --complementary--.

At column 10, line number 52, after "be", delete "about" and in line 59, before "30", delete "may include".

At column 11, line number 15, after "also", delete "and" and in line 32, after "power", delete "power".

At column 12, line number 2, change "applicants" to --applicant-- and in line 44, change "applicants'" to --applicant's--.

In the Claims:

At column 13, claim number 3, line number 30, after "operational", insert --amplifier--.

At column 15, claim number 14, line number 8, after "produce", insert --the--.

Signed and Sealed this
Fifth Day of July, 2011

David J. Kappos
*Director of the United States Patent and Trademark Office*